United States Patent [19]

Mote, Jr.

[11] Patent Number: 5,852,617
[45] Date of Patent: *Dec. 22, 1998

[54] JTAG TESTING OF BUSES USING PLUG-IN CARDS WITH JTAG LOGIC MOUNTED THEREON

[75] Inventor: L. Randall Mote, Jr., Laguna Hills, Calif.

[73] Assignee: Samsung Electronics Co., Ltd., Seoul, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 569,751

[22] Filed: Dec. 8, 1995

[51] Int. Cl.$^6$ .................................................. G01R 31/28
[52] U.S. Cl. .................................. 371/22.31; 395/183.19
[58] Field of Search .................................. 371/22.3, 22.1, 371/25.1, 22.31, 22.32, 22.34, 22.6, 27.6; 324/158.1, 73.1, 158 R; 395/575, 183.06, 183.01, 183.19, 183.21

[56] References Cited

U.S. PATENT DOCUMENTS

| | | | |
|---|---|---|---|
| 5,198,759 | 3/1993 | Ohnesorge | 324/158 R |
| 5,331,274 | 7/1994 | Jarwala et al. | 324/158.1 |
| 5,416,409 | 5/1995 | Hunter | 324/158.1 |
| 5,428,800 | 6/1995 | Hsieh et al. | 395/775 |
| 5,497,378 | 3/1996 | Amini et al. | 371/22.3 |
| 5,526,365 | 6/1996 | Whetsel | 371/22.3 |
| 5,544,309 | 8/1996 | Chang et al. | 395/183.06 |
| 5,608,736 | 3/1997 | Bradford et al. | 371/22.3 |

OTHER PUBLICATIONS

Maunder, et al., "IEEE Standard Test Access Port and Boundary–Scan Architecture", *Institute of Electrical and Electronics Engineers, Inc.*, Oct. 21, 1993, pp. iii–A–12.

"IEEE Standard Test Access Port and Boundary–Scan Architecture", Circuits and Devices Communications Technology, IEEE Std. 11.49.1–1990 (includes IEEE Std 1149.1A–1993), Oct. 21, 1993.

*Primary Examiner*—Robert W. Beausoliel, Jr.
*Assistant Examiner*—Nadeem Iqbal
*Attorney, Agent, or Firm*—Knobbe, Martens, Olson & Bear, LLP

[57] ABSTRACT

A plug-in JTAG test card includes JTAG boundary scan circuitry which may be used to drive JTAG test data out onto portions of buses connected to peripheral plug-in slots. One or more of the JTAG plug-in test cards can be used to verify the integrity of each of the point-to-point connections on the buses which terminate in the peripheral plug-in slots. In one advantageous embodiment, the plug-in JTAG test cards simulate a dual in-line memory module (DIMM) or single in-line memory module (SIMM) cards which include scan test buffer circuitry but do not actually include memory chips so that an inexpensive plug-in card can be used to provide JTAG testing at the manufacturing level for multiple motherboards. In a particularly preferred embodiment, JTAG boundary scan buffer circuits, such as, for example, SN74ABT8245's, are used as test circuits rather than for their intended use as interface circuits.

4 Claims, 7 Drawing Sheets

JTAG TESTING OF BUSES USING PLUG-IN CARDS WITH JTAG LOGIC MOUNTED THEREON

BACKGROUND OF THE INVENTION

1. Field of the Invention

The present invention relates to a system and method for testing buses on a printed circuit (PC) board using JTAG.

2. Description of the Related Art

A well-known method for testing circuitry on, for example, a PC card is set forth in the IEEE 1149.1 boundary-scan standard originated by the international Joint Test Action Group (JTAG), hereby incorporated by reference. One implementation of this standard involves designing components (e.g., integrated circuits) for serial boundary-scan testing by providing shift register elements daisy-chained to form a path around the periphery of the integrated circuit component.

The general concept for boundary scan testing using JTAG is to shift serial data in through a number of integrated circuit (IC) components to stimulate the circuitry on a PC card, and to sample IC input signals from the circuitry of the PC card. Since the interconnect topology and logic functions of the PC card are known (i.e., between a JTAG output signal and a JTAG input elsewhere on the PC card), a master testing circuit can compare the return data to an expected result (i.e., a result which is dependent upon the functions of the known circuitry and PC card interconnect). In other words, the serial data inputs applied to the circuit being tested produce known outputs if the PC card interconnect is correct and any circuitry between the JTAG source and sample points is functioning properly. The serial testing is also testing input and output pins and buffers of an integrated circuit which incorporates JTAG, since these lie between the JTAG output and the JTAG input sample points.

If the data stream returned to the master testing circuit is not as expected, then the interconnect path on the PC card is open or is shorted to another signal, or a malfunction exists in whatever logic exists along the path from the JTAG output to the JTAG input being analyzed. A careful analysis under software control of the deviations in the data stream may isolate any malfunctions within the PC card.

In certain instances it is desirable to test a branch or portion of a bus on a PC card. For example, when testing the design of a system, it is often important to test for short circuits or open circuits on the board. This is because tightly spaced pins may have solder bridges between adjacent pins. Alternatively, a missing or improperly formed solder connection may result in an open circuit.

However, sometimes the portion of the bus which is to be tested terminates in, for example, a memory slot so that there is no closed circuit formed by the bus. Thus, no JTAG circuitry is present on certain portions of the bus to be tested so that JTAG testing of the bus is not possible. This problem may exist, for example, in cases where no memory card is plugged into the memory slot, or where the memory card plugged into the slot does not have JTAG test capabilities. For example, a standard single in-line memory module (SIMM) or dual in-line memory module (DIMM) does not include JTAG test capabilities.

One solution to this problem is the use of a "bed of nails" tester which is custom designed and built to test the portions of the bus on the PC card which terminate in vacant slots. However, such bed-of-nails testers may cost thousands of dollars so that such a tester would be expensive in many cases. Additionally, the test fixture which customizes the bed-of-nails tester to a specific PC card requires time to fabricate, and might be unavailable for use in the prototype phase of the PC card's design. Therefore, a need continues to exist for an inexpensive apparatus and method for testing buses in a computer system or the like.

SUMMARY OF THE INVENTION

A system for testing point-to-point connections on a circuit board using JTAG comprises the circuit board, including circuitry which is to be tested using JTAG. A bus on the circuit board includes connection pins, while a plurality of plug-in peripheral or expansion slots are electrically coupled with the bus pins. A plug-in JTAG test card further engages with one of the plug-in slots to establish an electrical connection thereto. The test card includes JTAG test circuitry for driving test signals onto the bus pins via the plug-in slot engaged with the test card. Finally, the system includes a JTAG test circuit in communication with the bus on the circuit board. The test signals output by the test card are received by the JTAG test circuit for testing the integrity of point-to-point connections on the circuit board. In a preferred embodiment, the JTAG test circuit comprises a second JTAG test card engaged with a second plug-in slot. In an alternate preferred embodiment, the JTAG test circuit comprises an integrated circuit chip having JTAG test capability on the circuit board.

Under another aspect, the invention is a method of testing bus connections on a motherboard which interface with a plug-in slot. The method comprises the step of providing a plug-in test card having JTAG test components, including a boundary scan register. The test card is configured to plug into the plug-in slot. The method further includes the steps of plugging the test card into the plug-in slot; shifting a test vector comprising data bits into the boundary scan register; outputting the test vector data bits from the boundary scan register over the bus connections via the plug-in slot; receiving the output test vector data bits via the bus connections; capturing the test vector data bits via the JTAG boundary scan register; shifting the test data out of the boundary scan register and into the JTAG tester; and comparing the received output test vector data bits to a predetermined output pattern in order to identify malfunctions in the bus connections. In a preferred embodiment of the method, the steps of producing, engaging, shifting, outputting, receiving and comparing are repeated for each set of bus slot connections on the motherboard.

Under yet another aspect, the present invention is a system which tests bus connections that interface with plug-in slots on a motherboard. The system comprises the motherboard, the bus having connections which interface with the plug-in slots on the motherboard; and a plug-in test card. The plug-in test card further comprises a boundary scan register and a connector portion in communication with the boundary scan register. The connector portion is configured to engage with the plug-in slot to establish communication between the bus connections and the boundary scan register. The plug-in test card also includes boundary scan control circuitry comprising a TAP controller and an instruction register.

Under a still further aspect, the present invention is a system for testing multiple bus connections that interface with at least one plug-in slot on a motherboard. The multiple bus connections do not electrically communicate with JTAG test circuitry on the motherboard. The system comprises the motherboard, the bus having connections which interface with at least one plug-in slot on the motherboard, and at least one plug-in test card which engages with the plug-in slot to establish electrical communication between JTAG test circuitry on the plug-in test card and the bus connections. In a preferred embodiment, the JTAG test circuitry on the plug-in test card comprises a boundary scan register a TAP controller, and an instruction register.

Under another aspect, the present invention is a JTAG plug-in test card for use in testing bus connections on a motherboard which interface with plug-in peripheral or expansion slots. The test card comprises a connector portion which engages with the plug-in peripheral or expansion slots, a boundary scan register and an input bus which provides an input path by which signals from the connector are provided as inputs to the boundary scan register. The plug-in card additionally includes an output bus by which output signals from the connector are provided to the connector and boundary scan control circuitry. The boundary scan control circuitry comprises a TAP controller and an instruction register.

DETAILED DESCRIPTION OF THE PREFERRED EMBODIMENT

Figure 1:
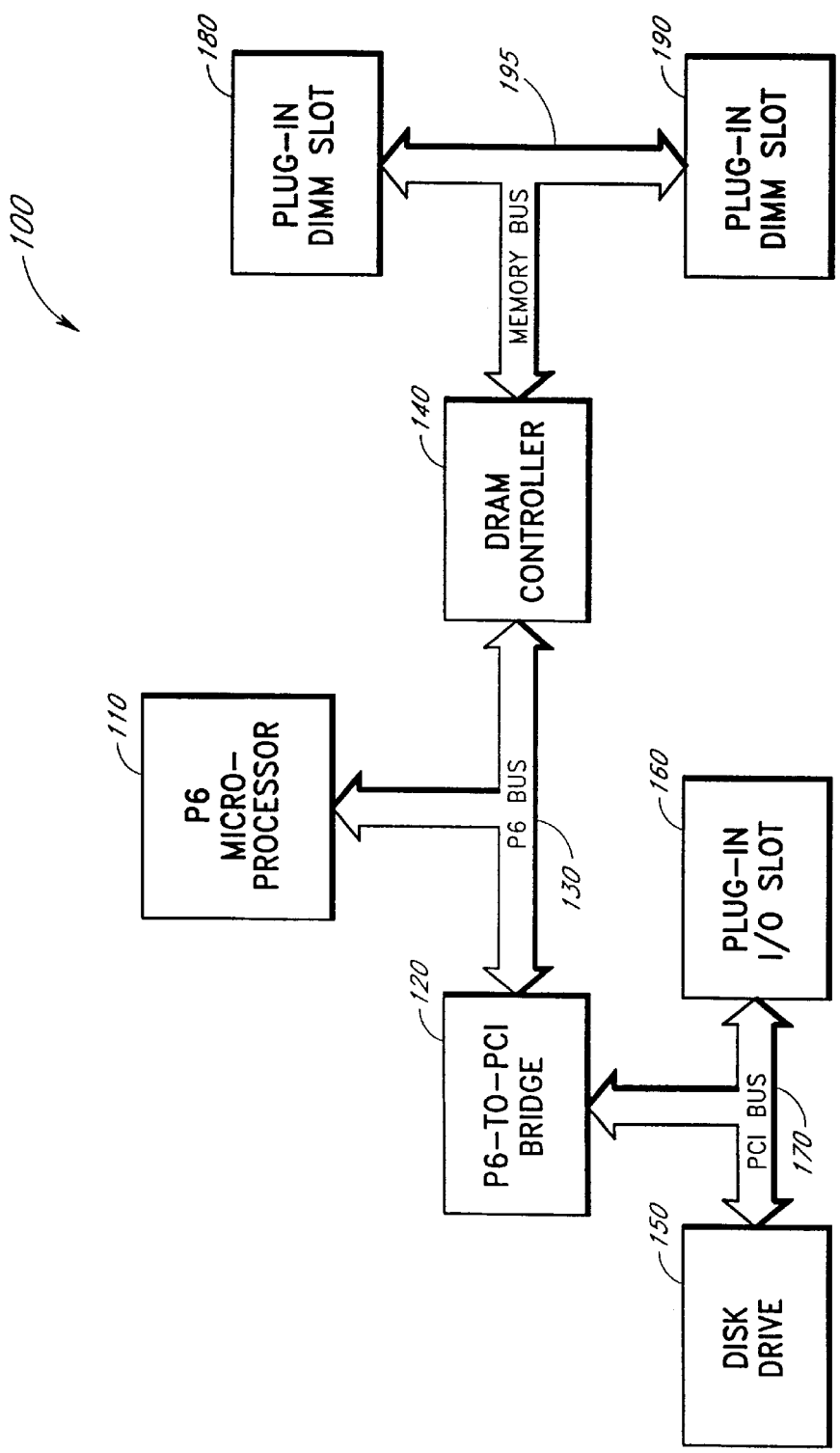
FIG. 1 is a simplified schematic block diagram of a computer system including a bus connecting to plug-in memory and input/output (I/O) slots.

FIG. 1 is a simplified schematic block diagram illustrating a computer system 100. The computer system 100 includes a microprocessor 110 which communicates with a bus bridge 120 and a dynamic random-access memory controller (DRAM) 140 via a system bus 130. In one advantageous embodiment, the microprocessor 110 comprises a P6 microprocessor, and the bus bridge 120 comprises a P6-to-PCI bridge. The P6-to-PCI bridge 120 communicates with a disk drive 150 and a plug-in I/O slot 160 via a peripheral component interconnect (PCI) bus 170. The DRAM controller 140 connects to a first plug-in, dual in-line memory module (DIMM) slot 180 and a second plug-in DIMM slot 190 via a memory bus 195. When the computer system 100 is operational, DIMMs (not shown in FIG. 1) having DRAM installed thereon are plugged into the slots 180, 190. Although the embodiment of FIG. 1 depicts DIMM plug-in cards, single in-line memory modules (SIMMs, not shown) could be used as well in accordance with the teachings of the present invention.

At the manufacturing stage it is desirable to be able to test each of the integrated circuit components, as well as each point-to-point connection between the circuit chips and along all of the buses using a JTAG boundary-scan test. However, in certain instances it may be difficult to test many of the point-to-point connections along some of the communication buses because one or more of the plug-in slots is empty or does not contain a module with JTAG compatibility.

Specifically, as shown in FIG. 1, the plug-in I/O slot 160 and the plug-in DIMM slots 180 and 190 may be vacant so that the PCI bus 170 and the memory bus 195 will terminate at an open junction. Consequently, there is no closed circuit through which to test the lines of the PCI bus 170 or the memory bus 195 using JTAG. Furthermore, the plug-in slots 160, 180, and 190 may, alternatively, include modules which are not JTAG compatible so that the slots 160, 180, and 190, as well as portions of the PCI buses 170, 195, would not be testable using JTAG.

Thus, in order to provide an inexpensive and efficient system and method to test each of the connections on the PCI bus 170 and the memory bus 195 using JTAG, and to test the DIMM slots 180, 190, a specially configured plug-in module 200 (see FIG. 2) is inserted into each of the slots which require JTAG compatibility for testing.

Figure 2:
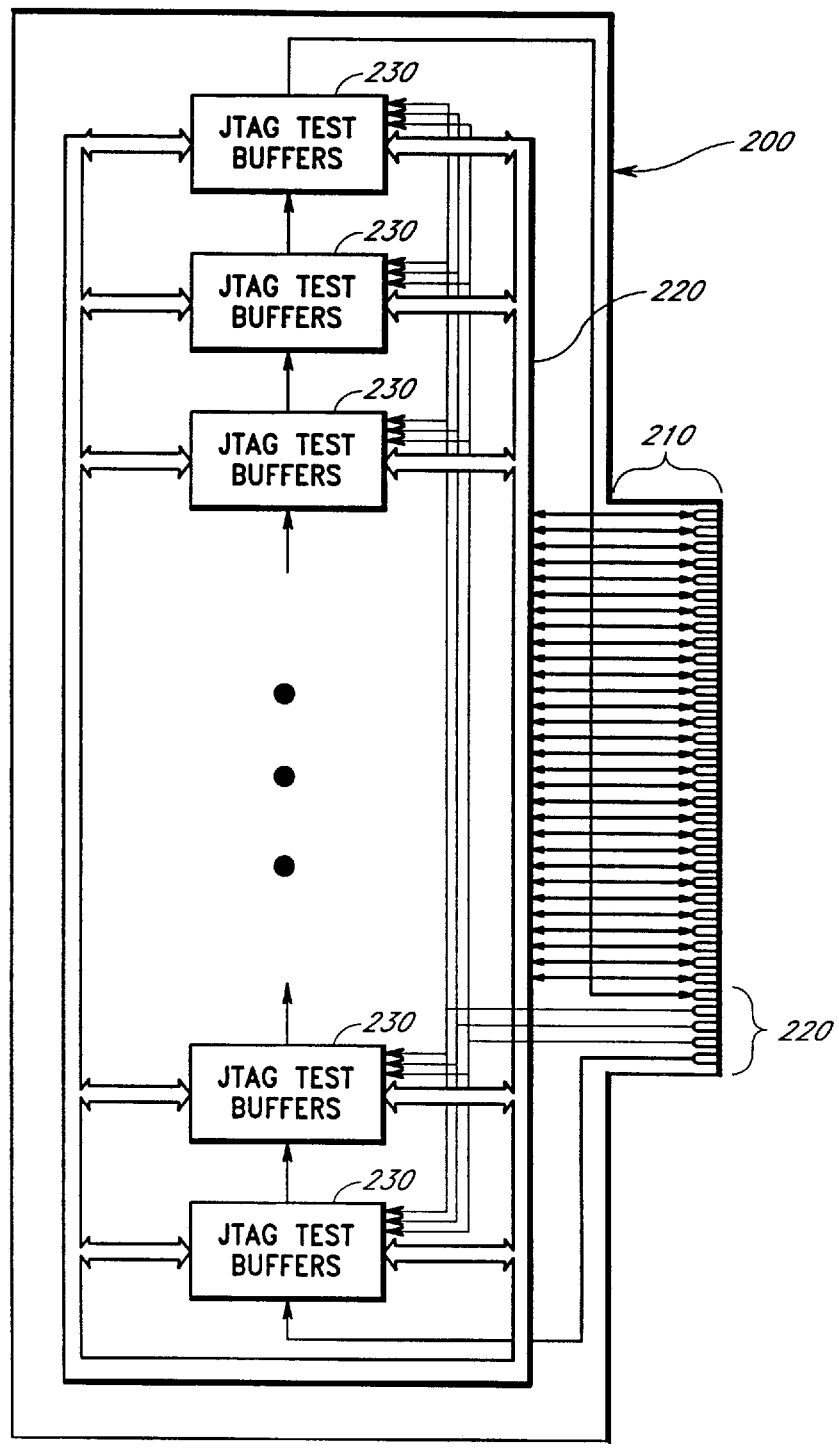
FIG. 2 is a schematic plan view showing one side of a dual in-line memory module (DIMM) plug-in card constructed in accordance with the present invention to include only JTAG buffer circuitry.

As shown in FIG. 2, the plug-in JTAG test card 200 includes a plug-in connector 210 which, for example, provides a multiple-pin connection with the memory bus 195 (or, alternatively, the PCI bus 170). A respective JTAG test card for each of the slots 160, 180, 190 has an appropriate connector for each of the slots 160, 180, 190. The plug-in JTAG test card 200 further includes a JTAG test interface 220 to a plurality of JTAG test buffers 230. As shown in FIG. 2, the JTAG test buffers 230 are used to connect to each signal pin of the intended bus to be tested (e.g., the memory bus 195 or the PCI bus 170). In one preferred embodiment, the JTAG test buffers 230 comprise the JTAG boundary scan logic found within octal bus transceivers available from Texas Instruments and sold under the model number of SN74ABT8245. This octal bus transceiver comprises two groups of eight JTAG bidirectional test buffers, each group sharing an output enable.

It should be noted that the plug-in card 200 does not include memory, although memory or other circuitry may be implemented on the card 200 as called for by specific applications. Rather, the plug-in card 200 is used only to complete the JTAG test circuit so that the card 200 has no functionality except as a JTAG test circuit. Thus, by inserting the JTAG test circuit 200 into one or more of the plug-in slots 160, 180, and 190, the busses 175, 190 can be inexpensively tested. Furthermore, the present invention costs significantly less than a bed-of-nails tester, which must be custom designed and built at costs of thousands of dollars.

During testing, one or more of the plug-in cards 200 can be inserted into receiving plug-in slots over and over again and used as a test circuit for buses on multiple computer systems to be tested.

When the plug-in cards 200 are used to test bus connections for buses already configured for JTAG testing (such as the PCI bus 170 shown in FIG. 1), the appropriate lines for shifting JTAG data and instructions into the data and instruction boundary registers (see FIGS. 3 and 4) within the JTAG test circuits are already provided. However, if the plug-in JTAG test card 200 is connected for test with a bus which is not normally configured for JTAG (such as an ISA bus, a conventional memory bus or a PCI bus without a useable JTAG interface), then special JTAG lines must be connected to the cards 200 via special connectors, as shown in FIGS.

5 and 6, so the data and instructions can be shifted into the JTAG data and instruction shift registers.

Figure 5:
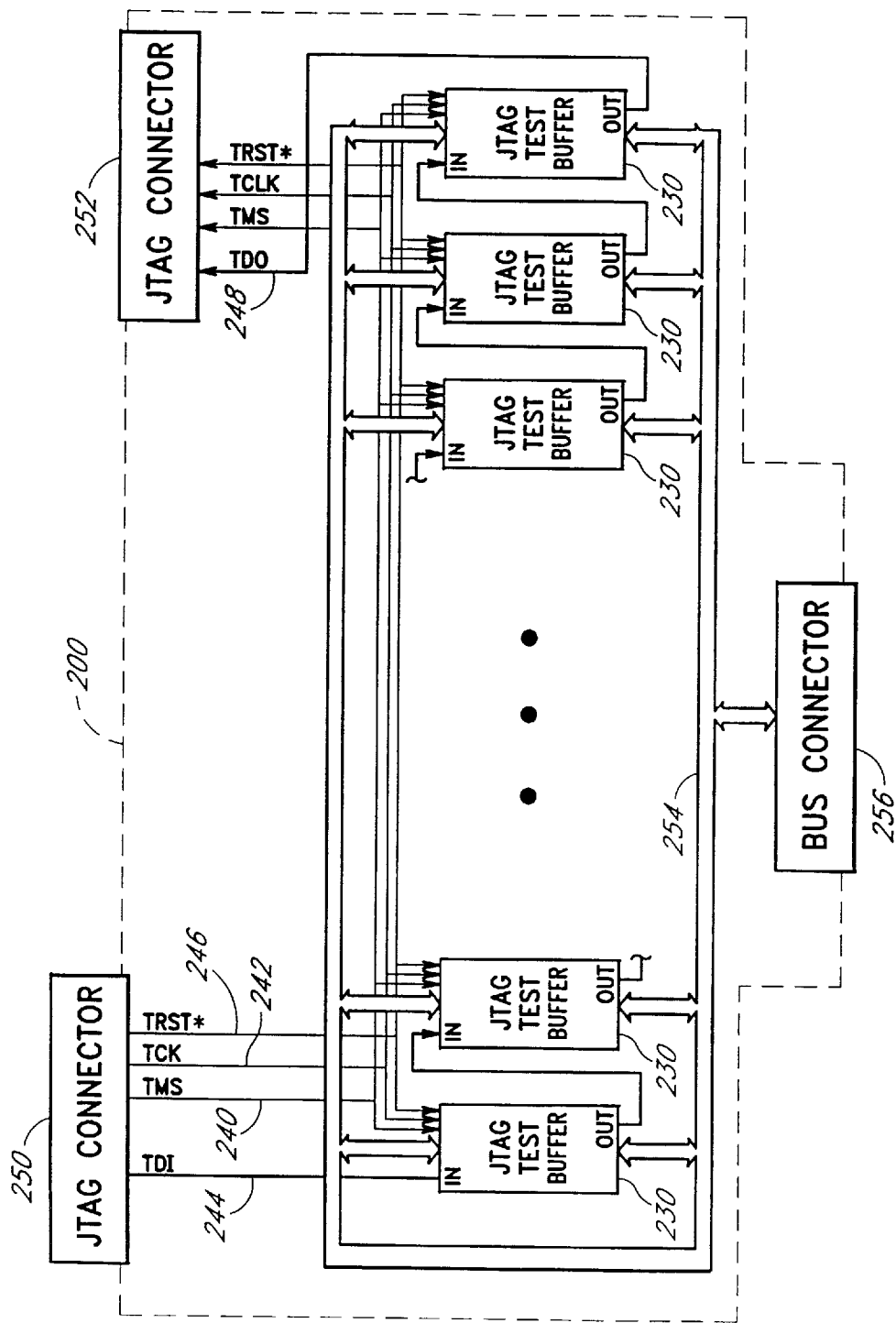
FIG. 5 schematically illustrates an embodiment of the plug-in card wherein the JTAG connections are formed on the back of the card opposite from the bus connections.

FIG. 5 schematically illustrates an embodiment of the plug-in card 200 wherein the JTAG connections are formed on the edge of the card opposite from the bus connections. Four JTAG lines, including a mode select (TMS) line 240, a clock (TCK) line 242, a data in (TDI) line 244 and an optional reset (TRST*) line 246 are connected to the JTAG test buffers 230. The TMS, TCK and TRST* lines 240, 242, 246 connect in parallel with each of the buffers 230, while the TDI line 244 connects in serial (i.e., in a daisy chain) through the test buffers 230, as is well understood in the art. A fifth JTAG data out (TDO) line 248 returns the output data from the last buffer 230. The input lines 240, 242, 244, 246 are connected to the card 200 in FIG. 5 via a JTAG input connector 250. The TMS, TCK and TRST* input lines 240, 242, 246 are also connected to a JTAG output connector 252, and the TDO line 248 is also provided to the JTAG output connector 252. A parallel bus 254 provides interconnections between a bus connector 256 and the input/output pins of the JTAG test buffers 230.

Figure 6:
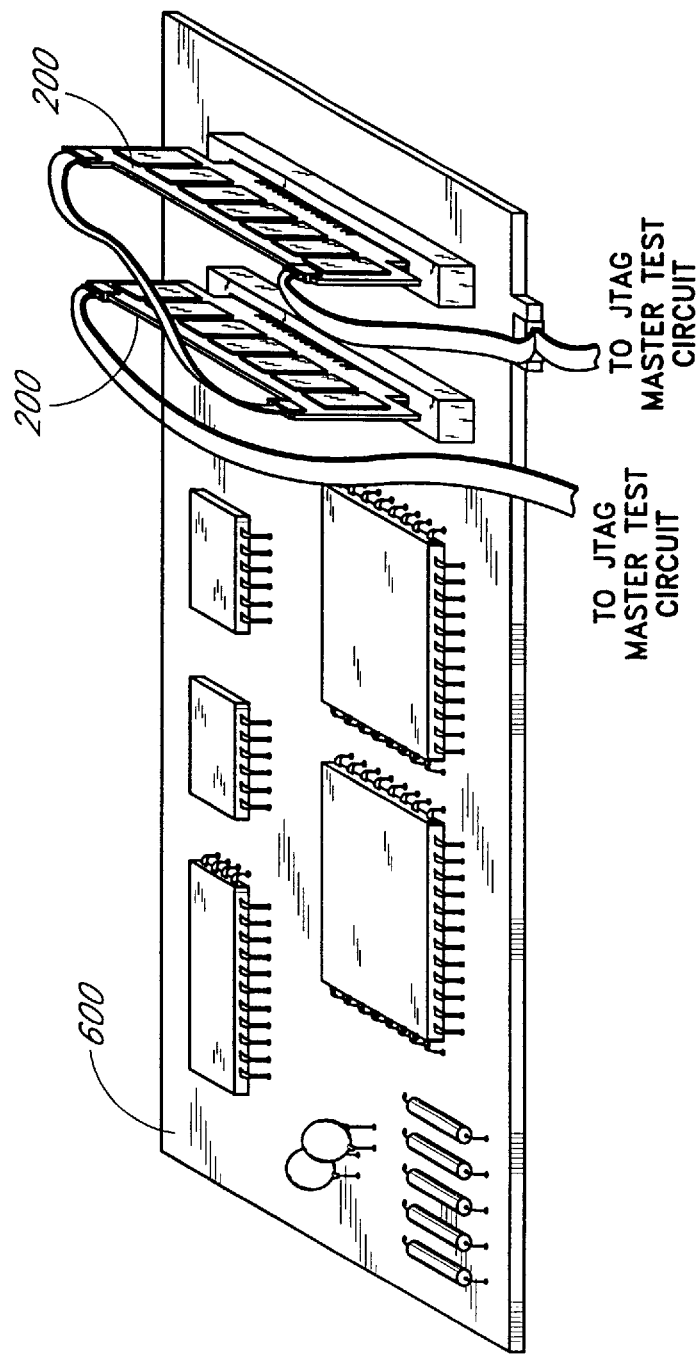
FIG. 6 illustrates multiple plug-in cards as connected during testing of a motherboard.

FIG. 6 illustrates multiple plug-in cards as connected during testing of a motherboard 600. As shown in FIG. 6, the JTAG test lines connect on the back of the cards 200 rather than through the bus connection because, in the application depicted, either the bus does not include JTAG test lines or the bus contains JTAG test lines which are not daisy chained with the motherboard's scan chain.

Figure 3:
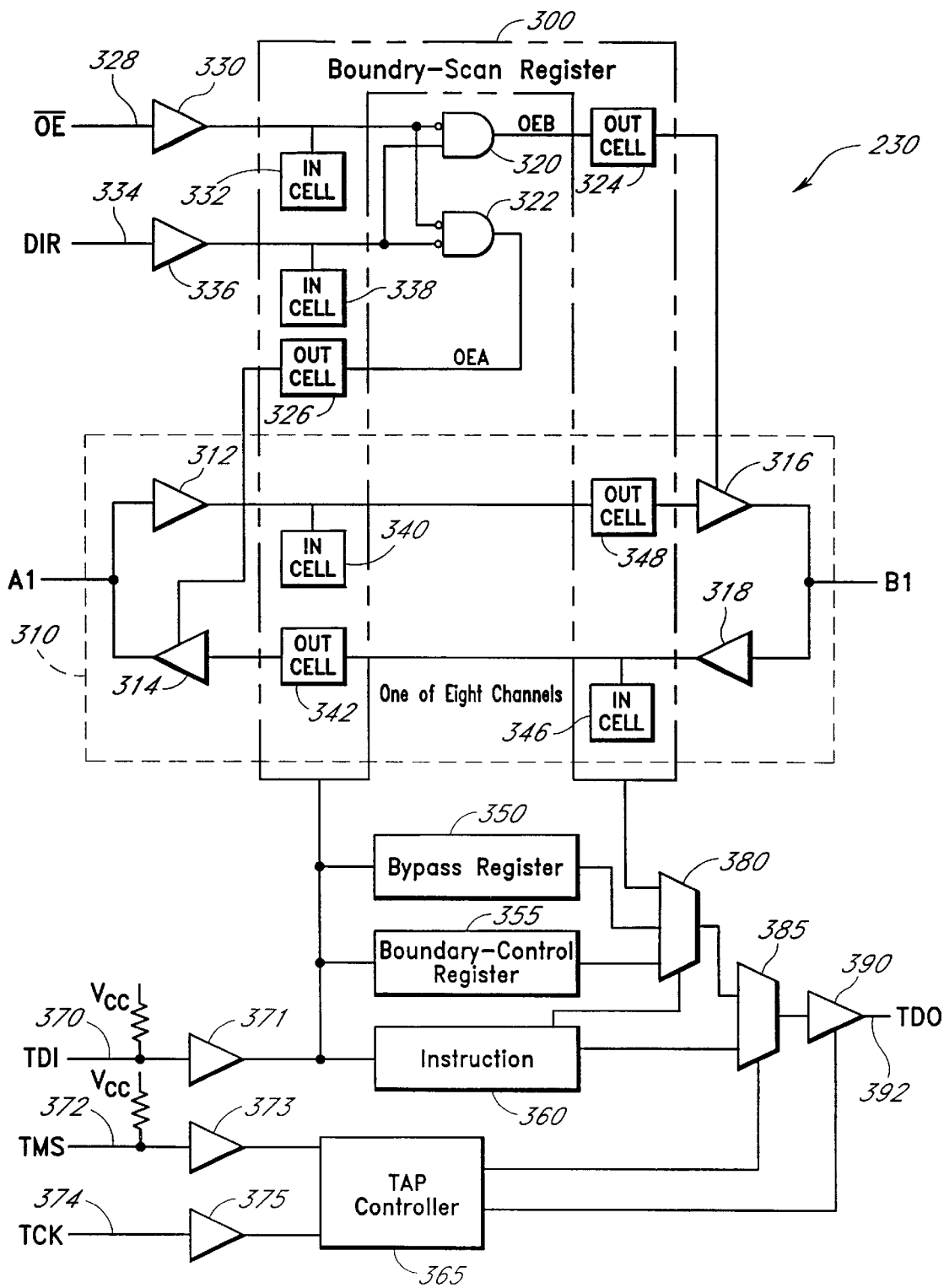
FIG. 3 is a schematic block diagram showing one of the boundary-scan test buffers implemented on the DIMM plug-in card of FIG. 2.

FIG. 3 is a functional block diagram of an SN74ABT8245. FIG. 3 depicts the internal circuitry of a commercially available IC which might be used to provide the scan test buffers 230 of FIG. 2. As shown in FIG. 3, the buffers 230 include a boundary scan register 300 and eight bidirectional buffer channels 310 (only one buffer channel 310 is shown in FIG. 3). Each bidirectional channel buffer 310 provides an interconnection between one bit of an A-bus (shown on the left in FIG. 3) and the corresponding bit of a B-bus (shown on the right in FIG. 3). Only the bidirectional channel buffer 310 for the interconnection between the first bit (A1) of the A-bus and the first bit (B1) of the B-bus is shown in FIG. 3. The other seven buffer channels (not shown) interconnect bits A2 and B2, bits A3 and B3, bits A4 and B4, bits A5 and B5, bits A6 and B6, bits A7 and B7, bits A8 and B8. Each buffer channel 310 includes respective input buffers 312, 318 and respective output buffers 314, 316. The output buffers 314, 316 are tri-state buffers having a high-impedance state controlled by the output enable A (OEA) and output enable B (OEB) outputs of an AND gate 320 and an AND gate 322, respectively, in the normal mode, and controlled by JTAG boundary scan output cells (OUT CELL) 324, 326, respectively, in the JTAG test mode.

The AND gate 320 receives a first inverting input from an active low output enable (OE) line 328 via a buffer 330. A JTAG boundary scan input cell (IN CELL) 332 in the boundary scan register 300 is connected to the output of the buffer 330 to monitor the state of the output enable line 328. A second non-inverting input to the AND gate 320 is provided by a direction (DIR) line 334 via a buffer 336. A JTAG boundary scan input cell 338 in the boundary scan register 300 is connected to the output of the buffer 336 to permit the state of the direction line 334 to be monitored. The AND gate 322 receives an inverted input from the output enable line 328 and receives an inverted input from the direction line 334 via the buffers 330, 336, respectively. It can thus be seen that in the originally intended use of the buffer 230, only one of the OEA and the OEB signals from the AND gates 320, 322 can be active at one time in accordance with the state of the DIR signal on the line 334. In the preferred embodiment, the output enable and direction lines 328, 334 are tied high so that when the scan test buffers 230 are not in the JTAG test mode, the sixteen I/O pins of the octal buffer are in a high-impedance mode and do not affect the bus being tested. In the JTAG mode described herein, the output enable line 328, the direction line 334 and the AND gates 320, 322 are not used, and the buffers are controlled solely by the JTAG output cells 324, 326.

Each of the eight channels is further controlled by an A-bus side JTAG input cell 340, an A-side JTAG output cell 342, a B-side JTAG input cell 346 and a B-side JTAG output cell 348 in the boundary scan register 300, as discussed more fully below in connection with FIGS. 4A and 4B.

The boundary scan register 300 receives data and instruction bits which may be shifted into the boundary scan register 300 under the control of conventional JTAG test circuitry. Specifically, the JTAG test circuitry which controls the boundary scan register 300 includes a bypass register 350, a boundary control register 355, an instruction register 360, and a TAP controller 365. The registers 350–360 receive a test data input (TDI) signal on a line 370 via a buffer 371. The TAP controller 365 receives a test mode select (TMS) signal on a line 372 via a buffer 373 and receives a test clock (TCK) signal on a line 374 via a buffer 375. The TAP controller 365 provides control outputs to the instruction register 360, the boundary control register 355, and the bypass register 350.

The output of the boundary scan register 300 is provided as a first input to a three-input multiplexer 380, while the outputs of the bypass register 350 and the boundary control register 355 serve as second and third inputs to the multiplexer 380. The instruction register 360 provides a select output to the multiplexer 380. The output of the multiplexer 380 serves as a first input to a 2:1 multiplexer 385, while the output of the instruction register 360 serves as a second input to the multiplexer 385. The tap controller provides a select input to the multiplexer 385 and also provides a tri-state input to a test data output buffer 390 which connects to the output of the multiplexer 385. The output of the output buffer 390 is the TDO signal on a line 392

The method for performing JTAG testing using the circuit of FIG. 3 is well-known to those of ordinary skill in the art. For example, see the above-incorporated IEEE 1149.1 JTAG boundary-scan standard for a description of the method used to shift in the appropriate test vectors, etc.

Figure 4A:
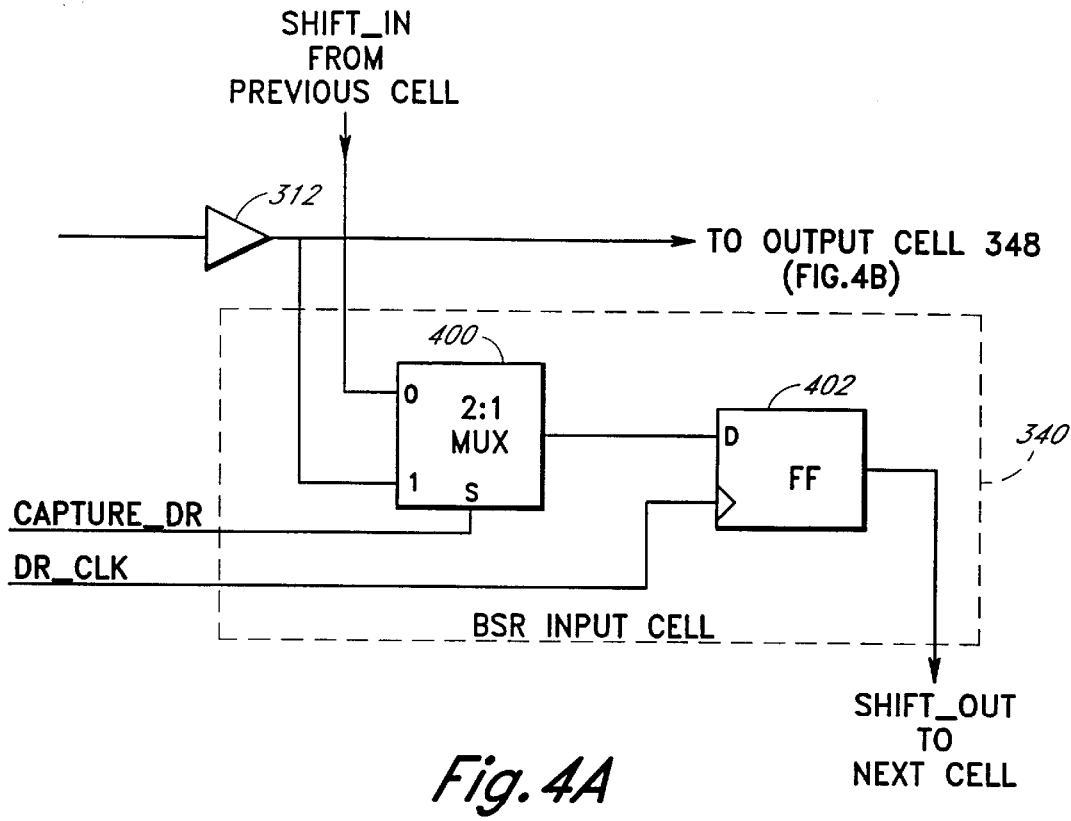
FIGS. 4A and 4B illustrate the internal elements of the boundary-scan register of FIG. 3 in greater detail.
Figure 4B:
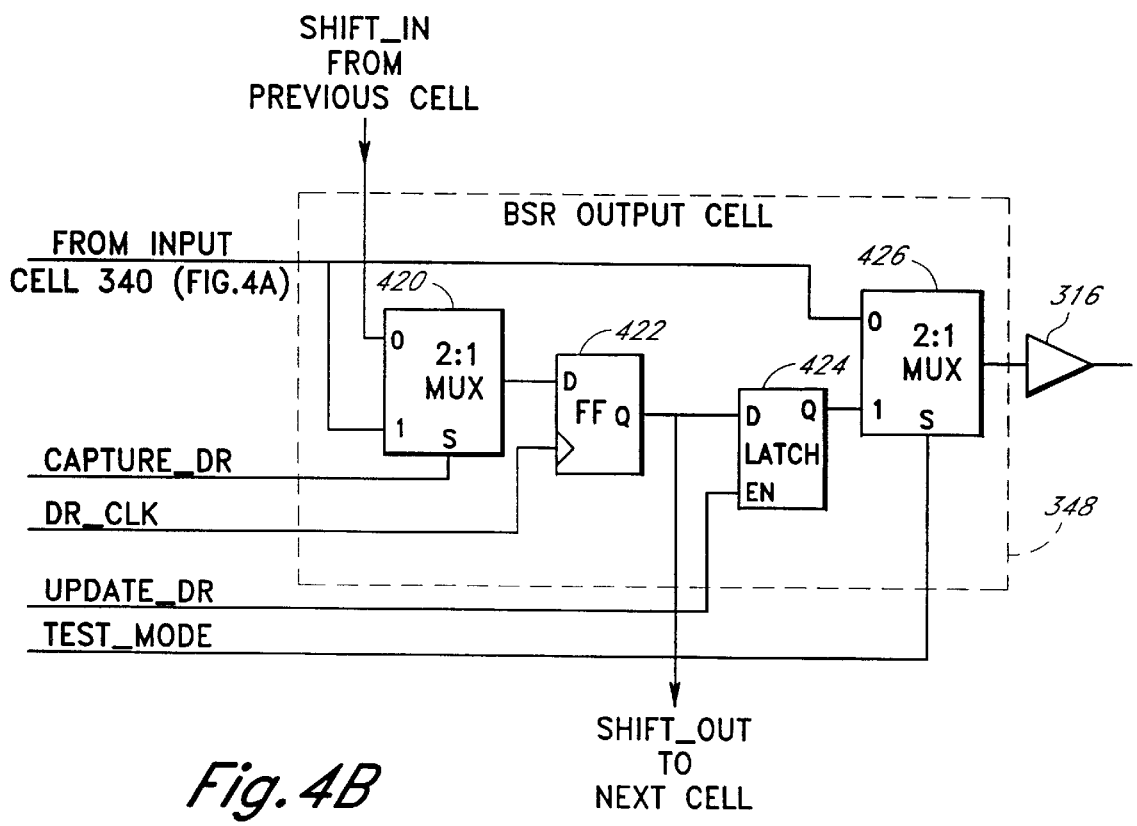

FIGS. 4A and 4B illustrate more detailed functional block diagrams of the input cells and output cells of the boundary scan register 300. In particular, the input cell 340 is illustrated in FIG. 4A and the output cell 348 is illustrated in FIG. 4B. The other input cells and output cells have similar configurations.

As shown in FIG. 4A, the exemplary input cell 340 comprises a 2-to-1 multiplexer 400 which receives a first input (0) from the boundary scan chain. That is, the first input is connected to receive the output of the previous input cell or output cell in the boundary scan register 300 or to receive the TDI input from the buffer 370 in FIG. 3. The multiplexer 400 has a second input (1) which receives the output of the input buffer 312. Other input cells (not shown) receive corresponding inputs from the boundary scan chain and from respective input buffers.

The multiplexer 400 has a select input (S) which is controlled by a CAPTURE_DR signal which is generated by the TAP controller 365 in FIG. 3. When the CAPTURE_DR signal is active, the multiplexer 400 selects the output of the input buffer 312. When the CAPTURE_DR signal is inactive, the multiplexer 400 selects the input from the boundary scan chain.

The output of the multiplexer 400 is provided as the data input (D) of a flip-flop 402 which is clocked by a data register clock (DR_CLK) signal generated by the TAP controller 365 (FIG. 3). The output (Q) of the flip-flop 402 is provided as the shift output of the input cell 340 which is provided as the shift input to the next cell in the boundary scan chain or, if the particular input cell is the last cell in the boundary scan chain, as the data output of the boundary scan register 300 to the multiplexer 380 in FIG. 3. During boundary scan shift operations, the CAPTURE_DR signal to the select input of the multiplexer 400 is inactive so that the flip-flop 402 is connected as part of a boundary scan shift register comprising the other input cells and the output cells.

As further illustrated in FIG. 4A, the output of the input buffer 312 is provided as an input to the output cell 348 described below in connection with FIG. 4B.

As illustrated in FIG. 4B, the exemplary output cell 348 comprises an input multiplexer 420 having a first input (0), a second input (1), a select input (S) and an output. The first input is connected to receive the output of the previous input cell or output cell in the boundary scan register 300 or to receive the TDI input from the buffer 370 in FIG. 3. The second input receives the output of the input buffer 312 (FIG. 4A). The select input is controlled by the CAPTURE_DR signal described above.

The output of the input multiplexer 420 is provided as the data input (D) of a flip-flop 422 which is also clocked by the DR_CLK signal described above. The data output (Q) of the flip-flop 422 is provided as the data input to a latch 424 which has a latch enable control input which is controlled by an UPDATE_DR signal generated by the TAP controller 365 in FIG. 3. The UPDATE_DR signal is activated by the TAP controller 365 in response to update instructions received via the TMS signal line 372 (FIG. 3).

The data output of the flip-flop 422 is also provided as the shift output of the output cell 348 which is provided as the shift input to the next cell in the boundary scan chain or, if the particular output cell is the last cell in the boundary scan chain, as the data output of the boundary scan register 300 to the multiplexer 380 in FIG. 3.

The output cell 348 further includes an output multiplexer 426 which has a first input (0), a second input (1), a select input S) and an output. The first input of the output multiplexer 426 receives the output of the input buffer 312 (FIG. 4A). The second input of the output multiplexer 426 receives the data output of the latch 424. The select input receives a TEST_MODE signal which is generated by the TAP controller 365 in response to the receipt of a test mode instruction on the TMS line 372. When the TEST_MODE signal is inactive, the output of the buffer 312 (FIG. 4A) is provided as the output of the output multiplexer 426 which is provided as the input to the output buffer 316 (also shown in FIGS. 3 and 4B). When the TEST_MODE signal is active, the output of the latch 424 is provides as the output of the output multiplexer 426 to the output buffer 316.

Output buffers 314 and 316 in FIG. 3 are enabled by signals from output cells 326 and 324, respectively. The output cells 326, 324 are similar to those described in FIG. 4B, with the exceptions that the outputs of the cells 324, 326 connect to the high impedance control input of their respective output buffer 316, 314. In addition, the inputs of the cells 326, 324 come from OEA and OEB (output enable A and output enable B), respectively.

In the SN74ABT8245 buffer 230 in the preferred embodiment of the present invention, the input cells 340 and the output cells 348 are connected in the boundary scan shift register as follows. The test data input (TDI) signal 370 is provided from the input buffer 371 to the OEB output cell 324, then to the OEA output cell 326, then to the DIR input cell 338, then to the OE input cell 332, then to the B-side input cells (B8, B7, B6, B5, B4, B3, B2, B1), then to the B-side output cells (B8, B7, B6, B5, B4, B3, B2, B1), then to the A-side input cells (A8, A7, A6, A5, A4, A3, A2, A1), then to the A-side output cells (A8, A7, A6, A5, A4, A3, A2, A1), and then to the test data output (TDO) signal via the multiplexer 380, the multiplexer 385 and the output buffer 390.

It should be noted that the JTAG test logic within the SN74ABT8245 integrated circuit is more complex than illustrated in FIGS. 4A and 4B. For simplicity, only the functions required for boundary scan testing are shown. A SN74ABT8245 integrated circuit also includes logic to support other JTAG functions which can also be used, but which are not required for implementation of the invention described herein.

In the testing operation provided by the present invention, the data shifted into the boundary scan register 300 are latched into the latches 424 in each of the output cells 342, 348, 326 and 324 connected to the A-bus and the B-bus, the output multiplexers 426 controlled to select the second inputs (1), and the output buffers 314 and 316 connected to each output cell 342, 348, and enabled by output cells 326, 324 so that a bus under test connected to the pins of the buffers 230 is driven with selected data from the buffers 230. The data on the bus are received by other logic connected to the bus under test and compared with expected data to determine whether each of the pins on the bus under test has been properly driven.

Conversely, the bus under test can be driven by other logic when the output buffers 314, 316 are disabled. The data on the bus under test are then received via the input buffers 312, 318 and captured in the respective flip-flops 402. Thereafter, the received data are shifted out of the boundary scan register 300 to the TDO line. The serial output data on the TDO are received by a JTAG test master (see FIG. 7) and compared with expected data to determine if the bus under test is functioning properly.

In this manner, the plug-in cards 200, including JTAG circuitry within the boundary scan register 300, provide an inexpensive and efficient system and method for testing portions of the PCI bus 170 and the memory bus 195 which, otherwise, would not be testable in a JTAG environment.

Figure 7:
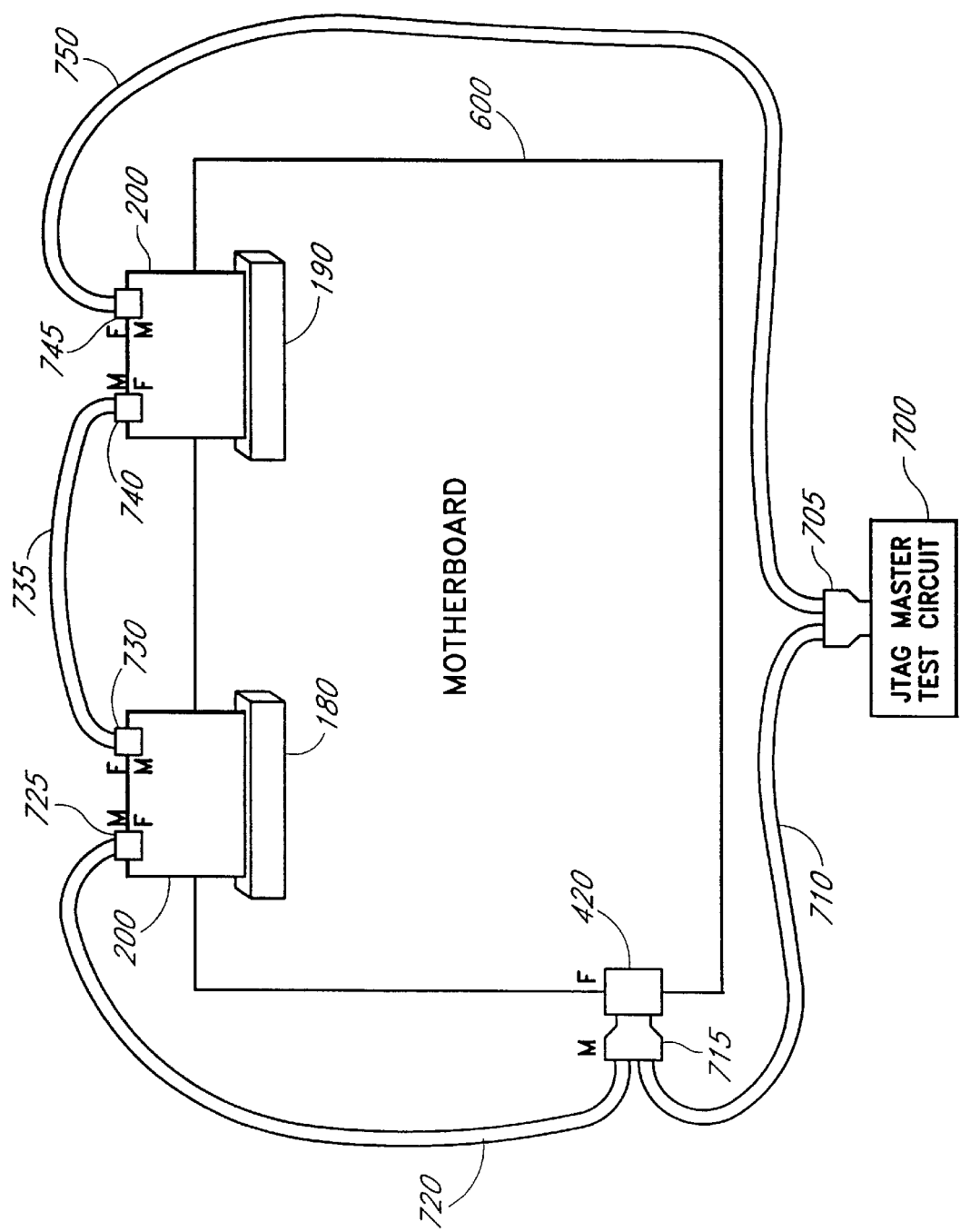
FIG. 7 illustrates a test system in accordance with the present invention.

In operation, as schematically illustrated in FIG. 7, JTAG commands and data are shifted into instruction and data registers within JTAG circuitry (not shown in FIG. 7) on the motherboard 600, and JTAG circuitry (also not shown in FIG. 7) on the first and second DIMM cards 200 from a JTAG master test circuit 700. The data and instructions are shifted into their respective registers via a connector 705, a cable 710, a connector 715, a connector 420, a cable 720, a connector 725, a connector 730, a cable 735, a connector 740, a connector 745 and a cable 750. The connector 715 engages with a mating connector 420 on the edge of the motherboard 600, as depicted in FIG. 7, while the connectors 725, 730, 740 and 745 engage with respective mating connectors on the edges of the plug-in cards 200. In one advantageous embodiment, the connectors 725, 730, 740 and 745 are alternately male and female type connectors (e.g., connector 725 of the cable 720 is a male connector, connector 730 of the cable 735 is a female connector, etc.) so that one or more of the plug-in cards 200 can be bypassed (if, for example, there is an empty slot). Thus, for example, if the slots 180, 190 are both empty, connector 725 of the cable 720 can engage directly with connector 745 of the cable 750 so that the JTAG master test circuit can be easily connected for test to as many circuits as support JTAG testing.

Once the appropriate data have been shifted into the JTAG registers, the data are applied to the connection points and are received by JTAG circuitry at another location in communication with the connection points. For example, the first plug-in card 200 (engaged with the slot 180) could output data onto the bus 195 (see FIG. 1) which is received, for example, by the DRAM controller 140. JTAG circuitry within the DRAM controller 140 (not shown) reads the data on the bus 195 and transfers it back to the JTAG master test circuit 700, via the connector 715, to be verified.

Although the preferred embodiment of the present invention has been described in detail above, it will be apparent to those of ordinary skill in the art that certain obvious modifications could be made to the present invention without departing from its spirit or essential characteristics. For example, inexpensive test circuits other than SN74ABT8245's described herein could be used to implement the JTAG plug-in test card 200. Therefore, the above description should be taken as illustrative but not restrictive. Accordingly, the scope of the present invention should be interpreted solely in light of the following appended claims.

What is claimed is:

1. A system which tests a plurality of bus connections that interface with plug-in slots on a motherboard, said system comprising:
   said motherboard;
   a bus having said plurality of bus connections which interface with said plug-in slots on said motherboard; and
   a plug-in test card further comprising:
      a boundary scan register;
      a first connector portion in communication with said boundary scan register, said first connector portion configured to engage with said plug-in slot to establish communication between said plurality of bus connections and said boundary scan register;
      a second connector portion for receiving at least one scan control signal;
      a third connector portion coupled to said at least one scan control signal, wherein said third connector portion provides said at least one scan control signal for output; and
      boundary scan control circuitry comprising:
         a TAP controller coupled to said at least one scan control signal; and
         an instruction register.

2. A JTAG plug-in test card for use in testing a plurality of bus connections on a motherboard which interface with unpopulated plug-in peripheral or expansion slots, said test card comprising:
   a first connector portion which engages with said unpopulated plug-in peripheral or expansion slots to provide electrical communication to said bus connections;
   a second connector portion for inputting JTAG control and data signals;
   a third connector portion coupled to at least one of said JTAG control signals and providing said at least one JTAG control signal for output;
   buffer circuitry coupled to at least a portion of said JTAG control and data signals, including:
      a boundary scan register;
      a TAP controller; and
      an instruction register;
   an input bus which provides an input path by which signals from said connector are provided as inputs to said boundary scan register;
   an output bus by which output signals from said boundary scan register are provided to said connector and thereby to said plurality of bus connections, and wherein said buffer circuitry is used solely as a JTAG test device and not as a buffer.

3. A JTAG plug-in test card as defined in claim 2, wherein said buffer circuitry comprises a 74ABT8245 octal buffer.

4. A JTAG plug-in test card for use in testing a plurality of bus connections on a motherboard which interface with a plug-in bus slot, said test card comprising:
   a first connector portion which engages with said plug-in bus slot;
   a second connector portion which provides an interface to JTAG data input and output lines and at which receives JTAG control lines;
   a third connector portion which is coupled to at least one of said JTAG control lines to thereby provide said at least one JTAG control line as an output; and
   an integrated circuit having a plurality of bus transceivers in electrical communication with said first connector portion to transmit data to and to receive data from said bus slot, said integrated circuit further including a JTAG interface which receives serial data and control signals from said second connector portion and which transfers data between said JTAG data lines and said bus transceivers thereby enabling said integrated circuit to operate as a JTAG test circuit which tests said bus slot and said plurality of bus connections, said integrated circuit not operating in accordance with the primary function of said integrated circuit, but as a JTAG test device.

* * * * *